(12) United States Patent
Jiang et al.

(10) Patent No.: US 10,680,151 B1
(45) Date of Patent: Jun. 9, 2020

(54) PACKAGED ILLUMINATING DEVICE

(71) Applicant: XIAMEN ECO LIGHTING CO. LTD., Xiamen (CN)

(72) Inventors: Hong Kui Jiang, Xiamen (CN); Hui Wu Chen, Xiamen (CN); Yan Biao Chen, Xiamen (CN); Wei Liu, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

(21) Appl. No.: 16/256,318

(22) Filed: Jan. 24, 2019

(51) Int. Cl.
| | |
|---|---|
| *H01L 33/62* | (2010.01) |
| *H01L 33/52* | (2010.01) |
| *H01L 27/15* | (2006.01) |
| *H05B 45/20* | (2020.01) |
| *H05B 45/44* | (2020.01) |

(52) U.S. Cl.
CPC ............ *H01L 33/62* (2013.01); *H01L 27/15* (2013.01); *H01L 33/52* (2013.01); *H05B 45/20* (2020.01); *H05B 45/44* (2020.01)

(58) Field of Classification Search
CPC ......... H01L 33/62; H01L 33/52; H01L 27/15; H01L 27/153; H01L 27/156; H05B 45/44; H05B 45/20
See application file for complete search history.

(56) References Cited

U.S. PATENT DOCUMENTS

| | | | |
|---|---|---|---|
| 2010/0141175 A1* | 6/2010 | Hasnain | ................. H01L 33/62 315/294 |
| 2012/0146066 A1* | 6/2012 | Tischler | ................ H01L 27/156 257/89 |
| 2014/0239824 A1* | 8/2014 | Li | ..................... H05B 33/0812 315/185 R |
| 2016/0309555 A1* | 10/2016 | Kang | ................ H05B 33/0815 |

* cited by examiner

*Primary Examiner* — Joseph C. Nicely
(74) *Attorney, Agent, or Firm* — Chun-Ming Shih; Lanway IPR Services

(57) ABSTRACT

A packaged illuminating device includes a hybrid light emitting device, a first plurality of bonding wires, a linear constant current circuit, a soldering plate, a second plurality of bonding wires and a protection layer. The hybrid light emitting device includes a plurality of illuminating elements having different or partially same luminance properties. The plurality of illuminating elements are disposed in respective proximities. The linear constant current circuit is electrically coupled to the hybrid light emitting device via the first plurality of bonding wires at a first plurality of pins of the linear constant current circuit. The linear constant current circuit powers up the plurality of illuminating elements using a constant DC voltage and controls duty cycles. The protection layer encapsulates the hybrid light emitting device, the first plurality of bonding wires, the linear constant current circuit, and the second plurality of bonding wires with the aid of the soldering plate.

19 Claims, 3 Drawing Sheets

PACKAGED ILLUMINATING DEVICE

BACKGROUND

1. Field of the Invention

The present invention relates to an illuminating device, and particularly relates to a packaged illuminating device.

2. Description of the Prior Art

Conventionally, a light emitting diode (LED) illuminating module may apply multiple LEDs of different illuminating colors, including a primary color temperature, for forming desired illuminance and/or an illuminating color in a mixed manner. However, driving such LED illuminating module requires a complicated circuitry and thereby a high fabrication cost, including a larger circuit volume. Such circuit volume introduces difficulties in packaging the LED illuminating module into integrated circuits.

SUMMARY OF INVENTION

The present invention discloses a packaged illuminating device. The packaged illuminating device includes a hybrid light emitting device, a first plurality of bonding wires, a linear constant current circuit, a soldering plate, a second plurality of bonding wires and a protection layer. The hybrid light emitting device includes a plurality of illuminating elements having different or partially same luminance properties. The plurality of illuminating elements are disposed in respective proximities. The first plurality of bonding wires are respectively connected to the plurality of illuminating elements. The linear constant current circuit is electrically coupled to the hybrid light emitting device via the first plurality of bonding wires at a first plurality of pins of the linear constant current circuit. The linear constant current circuit powers up the plurality of illuminating elements using a constant DC voltage and controls duty cycles of the plurality of illuminance elements based on the different or partially same luminance properties of the plurality of illuminating elements. The soldering plate loads the hybrid light emitting device, the first plurality of bonding wires, and the linear constant current circuit by soldering. The second plurality of bonding wires are loaded on the soldering plate by soldering. The second plurality of bonding wires are also connected to a second plurality of pins of the linear constant current circuit. The protection layer encapsulates the hybrid light emitting device, the first plurality of bonding wires, the linear constant current circuit, and the second plurality of bonding wires with the aid of the soldering plate.

In one example, the protection layer is made of a light transmittable material.

In one example, the protection layer is made of silicone having a high light transmittance.

In one example, the light transmittable material is capable of preventing physical damage and corrosion.

In one example, the light transmittable material has a high thermal conductivity.

In one example, the light transmittable material is light-transmittable alumina ceramic.

In one example, the protection layer and the soldering plate further encapsulate the hybrid light emitting device, the first plurality of bonding wires, the linear constant current circuit, and the second plurality of bonding wires by at least one of packaging types including through-hole package, surface mount, chip carrier, pin grid array, flat package, small outline package, and ball grid array.

In one example, the plurality of luminance properties include different or partially same luminance curves, operating voltage levels, and/or illuminating colors.

In one example, the plurality of illuminating elements are disposed in respective proximities for the purpose of mixing respective illuminating colors when the linear constant current circuit powers up the plurality of illuminating elements.

In one example, the linear constant current circuit utilizes a larger duty cycle for illuminating elements having desired illuminating colors.

In one example, the linear constant current circuit utilizes a smaller duty cycle for illuminating elements having undesired illuminating colors.

In one example, the illuminating colors include blue, green, red, and/or white.

In one example, the linear constant current circuit utilizes a shorter duty cycle for illuminating elements having sharper luminance curves.

In one example, the linear constant current circuit utilizes a larger duty cycle for illuminating elements having flatter luminance curves.

In one example, the linear constant current circuit utilizes a shorter duty cycle for illuminating elements having higher operating voltage levels.

In one example, the linear constant current circuit utilizes a larger duty cycle for illuminating elements having lower operating voltage levels.

In one example, the plurality of illuminating elements are arranged in an array. The array includes a plurality of illuminating element rows. Each of the plurality of illuminating element rows includes multiple illuminating elements connected in series.

In one example, the packaged illuminating device further includes a third plurality of bonding wires for connecting illuminating elements of each of the plurality of illuminating element rows in series.

In one example, at least one of the second plurality of bonding wires is electrically coupled to an external power source for powering up the linear constant current circuit.

These and other objectives of the present invention will no doubt become obvious to those of ordinary skill in the art after reading the following detailed description of the preferred embodiment that is illustrated in the various figures and drawings.

DETAILED DESCRIPTION

For neutralizing the complicated circuitry and high fabrication cost of a conventional LED illuminating module, the present invention discloses a packaged illuminating device that aims at a smaller circuitry volume without reducing its functionality.

Figure 1:
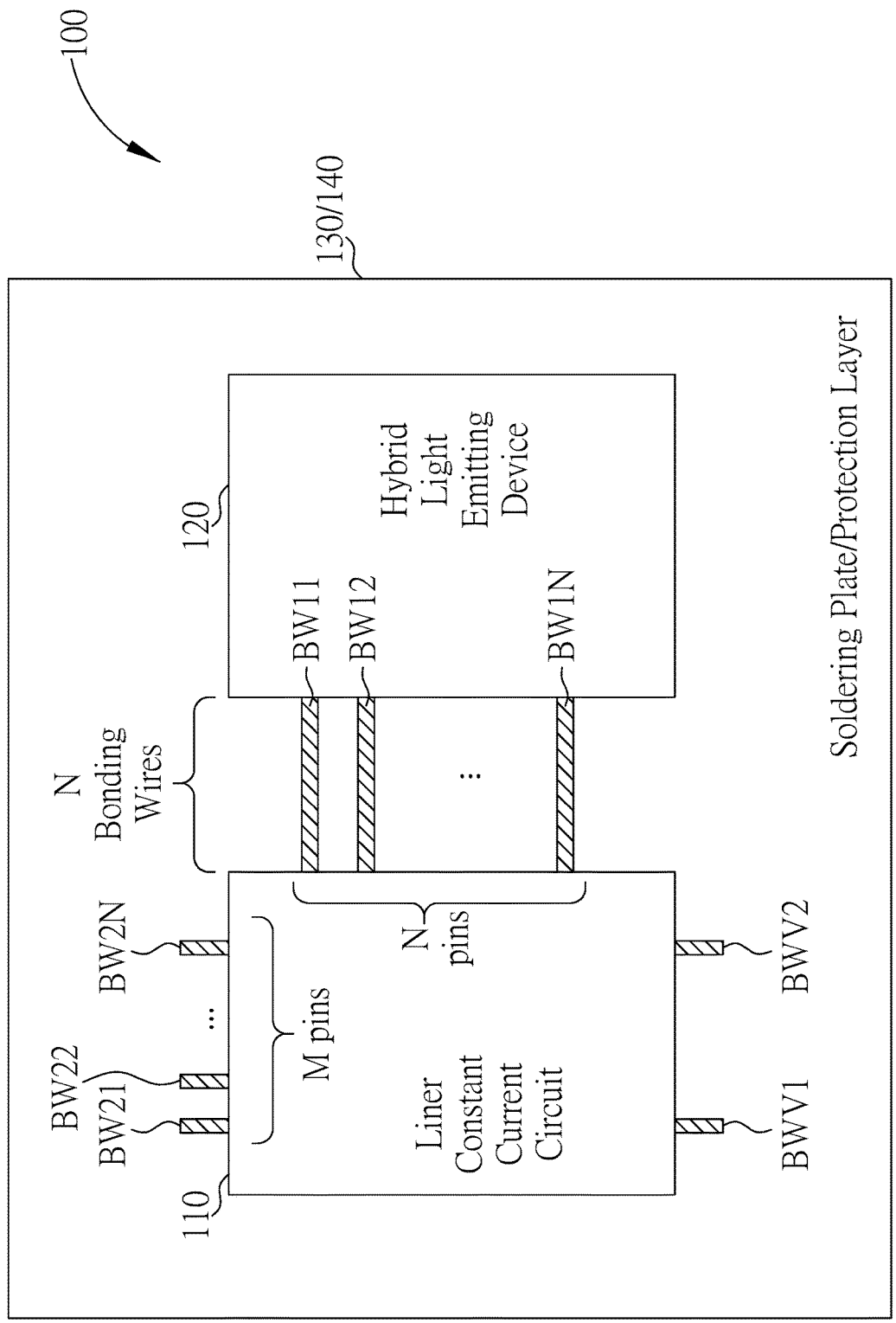
FIG. 1 illustrates a schematic top view of a packaged illuminating device according to one embodiment of the present invention.

FIG. 1 illustrates a schematic top view of a packaged illuminating device 100 according to one embodiment of the present invention. The packaged illuminating device 100 includes a hybrid light emitting device 120, a first set of N bonding wires BW11, BW12, . . . , BW1N, a linear constant current circuit 110, a soldering plate 130, a second set of bonding wires BW21, BW22, . . . , BW2N, and a protection layer 140, where N is a positive integer.

The hybrid light emitting device 120 includes multiple illuminating elements having different or partially same luminance properties. The multiple illuminating elements are also disposed in respective proximities. With the aid of such proximities among the plurality of illuminating elements, the hybrid light emitting device 120 is capable of generating a hybrid color and/or hybrid luminance.

Figure 2:
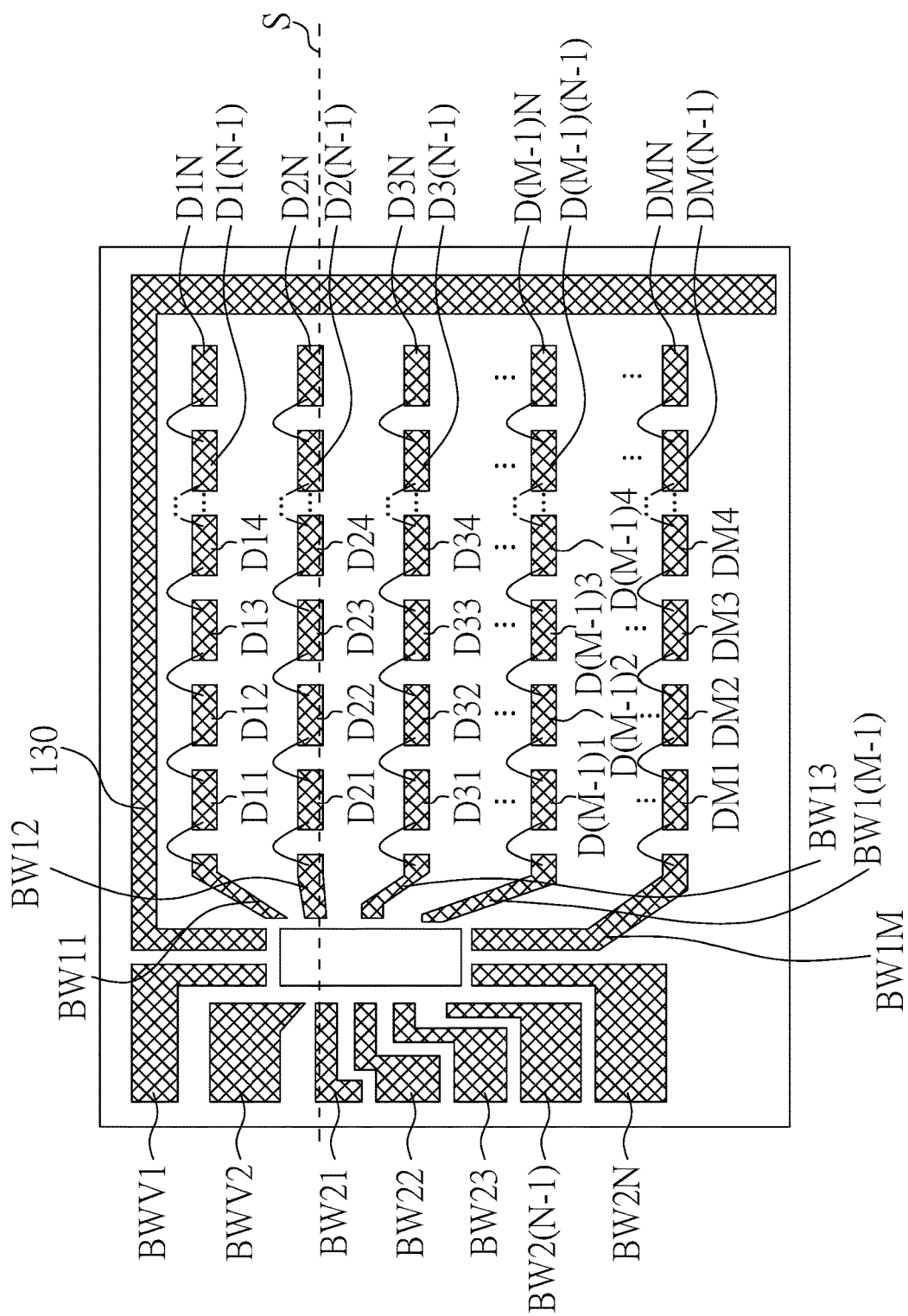
FIG. 2 illustrates details of a top view of a hybrid light emitting device shown in FIG. 1 according to one example of the present invention.

FIG. 2 illustrates details of the top view of the hybrid light emitting device 120 according to one example of the present invention. As illustrated, the multiple illuminating elements may be arranged in an array that has M rows and N columns, where both M and N are positive integers. For example, the multiple illuminating elements may include illuminating elements D11, D12, D13, D14, . . . , D1(N−1) and D1N connected in series as a first row, illuminating elements D21, D22, D23, D24, . . . , D2(N−1) and D2N connected in series as a second row, illuminating elements D31, D32, D33, D34, . . . , D3(N−1) and D3N connected in series as a third row, . . . , illuminating elements D(M−1)1, D(M−1)2, D(M−1)3, D(M−1)4, . . . , D(M−1)(N−1) and D(M−1)N connected in series as a (M−1)-th row, and illuminating elements DM1, DM2, DM3, DM4, . . . , DM(N−1) and DMN connected in series as an N-th row. In some examples, there are also multiple bonding wires for each row of the illuminating element array that connect respective members.

The first set of N bonding wires BW11, BW12, . . . , BW1N are respectively connected to one terminal of the multiple illuminating elements of the hybrid light emitting device 120, e.g., one terminal of the illuminating elements D11, D21, D31, . . . , D(M−1)1, DM1, as illustrated in FIG. 2.

Figure 3:
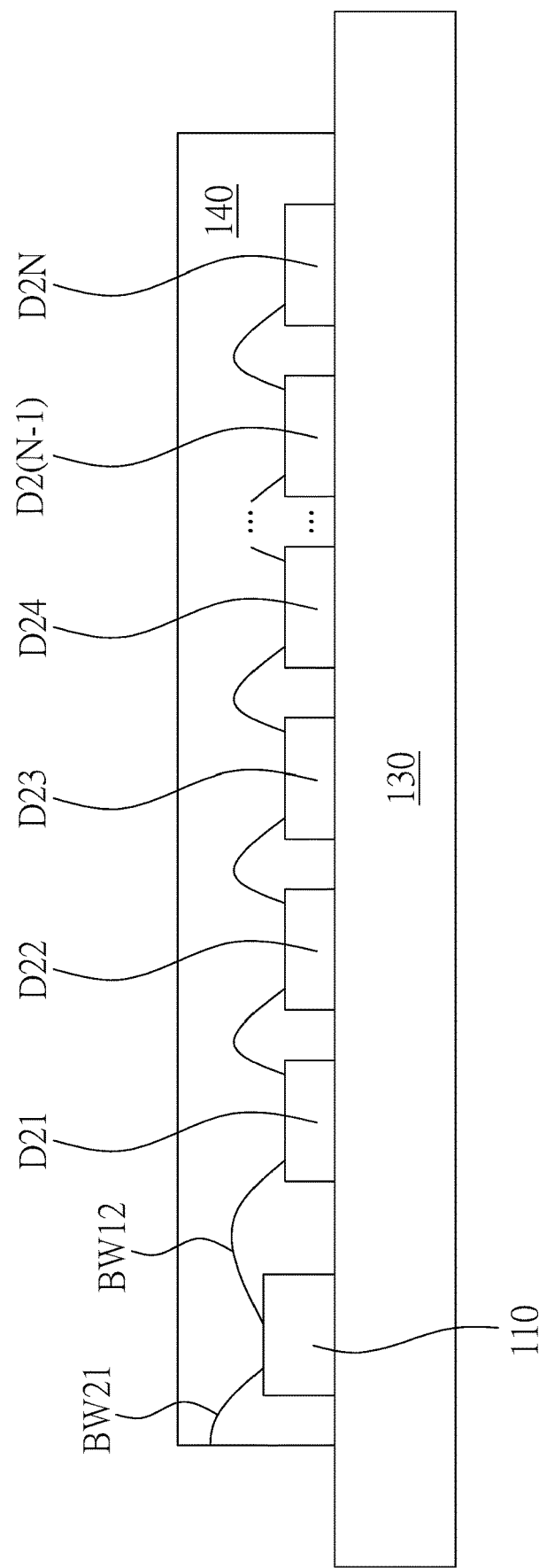
FIG. 3 illustrates a lateral view of the packaged illuminating device shown in FIG. 2.

For better understanding about FIG. 1 and FIG. 2, FIG. 3 additionally illustrates a lateral view based on a section line S that partitioned the packaged illuminating device 100 laterally. The linear constant current circuit 110 is electrically coupled to the hybrid light emitting device 120 via the first plurality of bonding wires BW11, BW12, . . . , BW1N at a first plurality of N pins of the linear constant current circuit 110. The linear constant current circuit 110 also powers up the hybrid light emitting device 120's illuminating elements via the plurality of illuminating elements BW11, BW12, . . . , BW1N. While powering up the illuminating elements, the linear constant current circuit 110 uses a constant DC voltage. The linear constant current circuit 110 also independently controls duty cycles of each row of the plurality of illuminance elements, based on the different or partially same luminance properties of the plurality of illuminating elements.

The soldering plate 130 loads the hybrid light emitting device 120, the first plurality of bonding wires BW11, BW12, . . . , BW1N, and the linear constant current circuit 110, and the second set of bonding wires BW21, BW22, . . . , BW2N by soldering.

The second set of bonding wires BW21, BW22, . . . , BW2N are respectively connected to a second plurality of pins of the linear constant current circuit 110.

The protection layer 140 encapsulates the hybrid light emitting device 120, the first plurality of bonding wires BW11, BW12, . . . , BW1N, the linear constant current circuit 110, and the second set of bonding wires BW21, BW22, . . . , BW2N with the aid of the soldering plate 130. In this way, packaging of the packaged illuminating device 100 is completed.

In some examples, the protection layer 140 is made of a light transmittable material, such that luminance emitted from the hybrid light emitting device 120's illuminating elements can be externally visible. For better achieving such purpose, in some examples, the protection layer 140 is made of silicone having a high light transmittance.

In some examples, the protection layer 140 can be designed to better prevent the packaged elements from external damage. For example, the protection layer 140 is capable of preventing physical damage and corrosion by its material. In one example, the protection layer 140 has a high thermal conductivity, for example, using the material of light-transmittable alumina ceramic.

In some examples, the packaging technology used by the protection layer 140 and the soldering plate 130 includes:

Through-hole package: Holes are drilled on the soldering plate 130 for mounting, i.e., loading, the hybrid light emitting device 120, the first plurality of bonding wires BW11, BW12, . . . , BW1N, the linear constant current circuit 110, and the second set of bonding wires BW21, BW22, . . . , BW2N. Particularly, the mounted elements have leads for soldering on the soldering plate 130. And the protection layer 140 is disposed to encapsulate the mounted elements last. The through-hole package technology introduces a high precision in packaging the packaged illuminating device 100.

Surface mount: The hybrid light emitting device 120, the first plurality of bonding wires BW11, BW12, . . . , BW1N, the linear constant current circuit 110, and the second set of bonding wires BW21, BW22, . . . , BW2N are directly mounted or placed on the soldering plate 130. And the protection layer 140 then packages the mounted or placed elements. The surface mount technology speeds up the packaging process of the packaged illuminating device 100.

Chip carrier: The soldering plate 130 and the protection layer 140 form a rectangular package for packaging the hybrid light emitting device 120, the first plurality of bonding wires BW11, BW12, . . . , BW1N, the linear constant current circuit 110, and the second set of bonding wires BW21, BW22, . . . , BW2N, with contacts on four edges. In such package, metal leads are wrapped around the package's edges and are secured to the soldering plate 130 by soldering. The chip carrier design is easier in circuit testing because of the surrounding metal leads.

Pin grid array: First, the soldering plate 130 and the protection layer 140 form a square or rectangular package for packaging the hybrid light emitting device 120, the first plurality of bonding wires BW11, BW12, . . . , BW1N, the linear constant current circuit 110, and the second set of bonding wires BW21, BW22, . . . , BW2N. Second, additional pins are disposed at the bottom of the soldering plate 130 for allowing more pins that interact with the packaged illuminating device 100. Under the circumstance that either the linear constant current circuit 110 or even the hybrid light emitting device 120 require more pins, i.e., a larger positive integer M or N, the pin grid array technology is a better fit for the packaged illuminating device 100 for more complicated control.

Flat package: First, the soldering plate 130 and the protection layer 140 form a square or rectangular package for packaging the hybrid light emitting device 120, the first plurality of bonding wires BW11, BW12, ..., BW1N, the linear constant current circuit 110, and the second set of bonding wires BW21, BW22, ..., BW2N. Second, additional pins are disposed at the lateral sides of the package. The flat package technology is an alternative for the pin grid array but has a better adaptability to various types of components, including an external voltage source that powers up the packaged illuminating device 100 or an external control unit that controls operations of the packaged illuminating device 100.

Small outline package: After the hybrid light emitting device 120, the first plurality of bonding wires BW11, BW12, ..., BW1N, the linear constant current circuit 110, and the second set of bonding wires BW21, BW22, ..., BW2N are packaged by the soldering plate 130 and the protection layer 140, the surface mount technology is additionally applied to attach pins around the surface of the package. In this way, the packaged illuminating device 100 is less liable to vibrations of input voltages or control signals. Such that operations of the packaged illuminating device 100 acquire a better reliability.

Ball grid array: After the hybrid light emitting device 120, the first plurality of bonding wires BW11, BW12, ..., BW1N, the linear constant current circuit 110, and the second set of bonding wires BW21, BW22, ..., BW2N are packaged by the soldering plate 130 and the protection layer 140, the whole bottom surface of the soldering plate 130 is modified as a plate densely filled with pins. Such packaging requires a high precision in fabrication but also has a high flexibility in circuit design.

The abovementioned packaging methods cover various advantages of the packaged illuminating device 100. The most important advantage lies in the fact that the packaged illuminating device 100 achieves a high-density and thus low-volume circuitry in comparison of the conventional LED illuminating module. Such that the packaged illuminating device 100 is easier in integration with various types of devices.

As mentioned above, the hybrid light emitting device 120's illuminating elements have different or partially same luminance properties. Details of the exemplary luminance properties are described in the following paragraphs.

In some examples, laminating elements of a same row in the hybrid light emitting device 120 are preferably having same luminance properties for easier control respective luminance properties.

In the case that the luminance property indicates a luminance curve of laminating elements, a luminance curve of an illuminating element indicates a function that associates an inputted operating current and/or operating voltage with an outputted luminance. By disposing the M rows of laminating elements in respective proximities, a combination of luminance curves of the M rows of laminating elements can be inducted, such that a required luminance of the hybrid light emitting device 120 can be more easily achieved.

In one example, a shorter duty cycle is determined for a row of illuminating elements having a sharper curve in the hybrid light emitting device 120. Such that the row of illuminating elements can be better prevented from being damaged by an instantly-increasing input voltage or input current. Similarly, a larger duty cycle is also determined for a row of illuminating elements having a smoother curve in the hybrid light emitting device 120. In this way, the hybrid light emitting device 120 can be better prevented from insufficient luminance.

Similarly, under the case that the luminance property indicates operating voltages of illuminating elements of the hybrid light emitting device 120, i.e., junction voltages. For appropriately manipulating the M rows of illuminating elements simultaneously under different operating voltages, the hybrid illumination module 140 requires one terminal of each of the M rows of illuminating elements to be electrically coupled together, and requires that the other terminal of each of the M rows of illuminating elements to be electrically coupled to a different control pin of the linear constant current circuit 130, such as anyone of the pins BW21, BW22, ..., BW2N. Similarly, M control signals can be respectively forwarded to the pins BW11, BW12, ..., BW1N for respectively control duty cycles of the M rows of illuminating elements. In one example, when the M rows of illuminating elements are all light emitting diodes (LEDs), the one terminal that connects to the pins BW11, BW12, ..., BW1N respectively may be the positive terminal of a LED; and the other terminal is the negative terminal of a LED. Similarly, in another example, the one terminal that connects to the pins BW11, BW12, ..., BW1N respectively may be the negative terminal of a LED; and the other terminal is the positive terminal of a LED.

In one example, the luminance property indicates an operating voltage level of a same row of illuminating elements. Under such case, a smaller duty cycle is determined for a row of illuminating elements having a higher operating voltage level. Such disposition aims at preventing the same row of illuminating elements from being seriously damaged by an over-high operating voltage. Similarly, a larger duty cycle is determined for a same row of illuminating elements having a lower operating voltage level. Such disposition aims at keeping enough luminance of the same row of illuminating elements.

In one example, the luminance property indicates the illuminating color of a same row of illuminating elements. The illuminating colors of different rows of illuminating elements may include blue, green, red, and/or white. Under certain conditions, white may be the primary color temperature for a better luminance control. In one example, a larger duty cycle is determined for a same row of illuminating elements having a same illuminating color that help in achieving a desired and mixed illuminating color. In another example, a smaller duty cycle is determined for a same row of illuminating elements having a same illuminating color that does not help in achieving a desired and mixed illuminating color.

In one example, at least two additional pins, e.g., power pins BWV1 and BWV2, are additionally disposed in the linear constant current circuit 110 to receive external power for powering up the hybrid light emitting device 120. The received powers may also serve as at least an upper bound operating voltage and a lower bound operating voltage for operating the hybrid light emitting device 120.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:
1. A packaged illuminating device, comprising:
   a hybrid light emitting device, comprising a plurality of illuminating elements having different or partially same luminance properties, the plurality of illuminating elements are disposed in respective proximities;

a first plurality of bonding wires, respectively connected to the plurality of illuminating elements;

a linear constant current circuit, electrically coupled to the hybrid light emitting device via the first plurality of bonding wires at a first plurality of pins of the linear constant current circuit, and configured to power up the plurality of illuminating elements using a constant DC voltage and to control duty cycles of the plurality of illuminance elements based on the different or partially same luminance properties of the plurality of illuminating elements;

a soldering plate, configured to load the hybrid light emitting device, the first plurality of bonding wires, and the linear constant current circuit by soldering;

a second plurality of bonding wires, loaded on the soldering plate by soldering, connected to a second plurality of pins of the linear constant current circuit; and a protection layer, configured to encapsulate the hybrid light emitting device, the first plurality of bonding wires, the linear constant current circuit, and the second plurality of bonding wires with the aid of the soldering plate.

2. The packaged illuminating device of claim 1, wherein the protection layer is made of a light transmittable material.

3. The packaged illuminating device of claim 2, wherein the protection layer is made of silicone having a high light transmittance.

4. The packaged illuminating device of claim 1, wherein the protection layer is capable of preventing physical damage and corrosion.

5. The packaged illuminating device of claim 1, wherein the protection layer has a high thermal conductivity.

6. The packaged illuminating device of claim 5, wherein the protection layer is light-transmittable alumina ceramic.

7. The packaged illuminating device of claim 1, wherein the protection layer and the soldering plate are further configured to encapsulate the hybrid light emitting device, the first plurality of bonding wires, the linear constant current circuit, and the second plurality of bonding wires by at least one of packaging types including through-hole package, surface mount, chip carrier, pin grid array, flat package, small outline package, and ball grid array.

8. The packaged illuminating device of claim 1, wherein the plurality of luminance properties comprises different or partially same luminance curves, operating voltage levels, and/or illuminating colors.

9. The packaged illuminating device of claim 8, wherein the plurality of illuminating elements are disposed in respective proximities for the purpose of mixing respective illuminating colors when the linear constant current circuit powers up the plurality of illuminating elements.

10. The packaged illuminating device of claim 8, wherein the linear constant current circuit utilizes a larger duty cycle for illuminating elements having desired illuminating colors.

11. The packaged illuminating device of claim 8, wherein the linear constant current circuit utilizes a smaller duty cycle for illuminating elements having undesired illuminating colors.

12. The packaged illuminating device of claim 8, wherein the illuminating colors comprise blue, green, red, and/or white.

13. The packaged illuminating device of claim 8, wherein the linear constant current circuit utilizes a shorter duty cycle for illuminating elements having sharper luminance curves.

14. The packaged illuminating device of claim 8, wherein the linear constant current circuit utilizes a larger duty cycle for illuminating elements having flatter luminance curves.

15. The packaged illuminating device of claim 8, wherein the linear constant current circuit utilizes a shorter duty cycle for illuminating elements having higher operating voltage levels.

16. The packaged illuminating device of claim 8, wherein the linear constant current circuit utilizes a larger duty cycle for illuminating elements having lower operating voltage levels.

17. The packaged illuminating device of claim 1, wherein the plurality of illuminating elements are arranged in an array that comprises a plurality of illuminating element rows, and each of the plurality of illuminating element rows comprises multiple illuminating elements connected in series.

18. The packaged illuminating device of claim 17, further comprising a third plurality of bonding wires for connecting illuminating elements of each of the plurality of illuminating element rows in series.

19. The packaged illuminating device of claim 1, wherein at least one of the second plurality of bonding wires is electrically coupled to an external power source for powering up the linear constant current circuit.

\* \* \* \* \*